(12) United States Patent
Bourstein

(10) Patent No.: US 9,086,453 B2
(45) Date of Patent: Jul. 21, 2015

(54) METHOD AND APPARATUS FOR TESTING INTEGRATED CIRCUITS

(75) Inventor: Ido Bourstein, Pardes Hana (IL)

(73) Assignee: MARVELL INERNATIONAL LTD., Hamilton (BM)

( * ) Notice: Subject to any disclaimer, the term of this patent is extended or adjusted under 35 U.S.C. 154(b) by 234 days.

(21) Appl. No.: 13/463,200

(22) Filed: May 3, 2012

(65) Prior Publication Data

US 2012/0293195 A1 Nov. 22, 2012

Related U.S. Application Data

(60) Provisional application No. 61/487,157, filed on May 17, 2011.

(51) Int. Cl.
*G01R 31/317* (2006.01)

(52) U.S. Cl.
CPC ................................ *G01R 31/31721* (2013.01)

(58) Field of Classification Search
CPC .................... G01R 31/32924; G06F 1/3203
See application file for complete search history.

(56) References Cited

U.S. PATENT DOCUMENTS

| 8,370,654 B1 * | 2/2013 | Hasko et al. ................. 713/300 |
| 2008/0024159 A1 * | 1/2008 | Tilbor et al. ................ 324/99 R |
| 2010/0253314 A1 * | 10/2010 | Bitting ........................... 323/313 |

OTHER PUBLICATIONS

U.S. Appl. No. 13/215,447, filed Aug. 23, 2011, by Ido Bourstein, entitled "Method and Apparatus for Testing Integrated Circuits.".
U.S. Appl. No. 12/979,724, filed Dec. 28, 2010, by Eran Rotem, entitled "Method and Apparatus for Increasing Yield.".
U.S. Appl. No. 12/730,829, filed Mar. 24, 2010, by Meir Flasko et al., entitled "AVS-Adaptive Voltage Scaling.".

* cited by examiner

*Primary Examiner* — Melissa Koval
*Assistant Examiner* — Courtney McDonnough

(57) ABSTRACT

Aspects of the disclosure provide a testing method. The method includes supplying a power supply from a voltage regulator to a device under test (DUT). The DUT includes an adaptive voltage scaling module configured to generate a feedback signal in response to the power supply. Further, the method includes receiving the feedback signal from the DUT to the voltage regulator to regulate the power supply based on the feedback signal from the DUT, and determining whether the DUT meets a specified performance requirement while the voltage regulator regulates the power supply provided to the DUT based on the feedback signal received from the DUT.

18 Claims, 3 Drawing Sheets

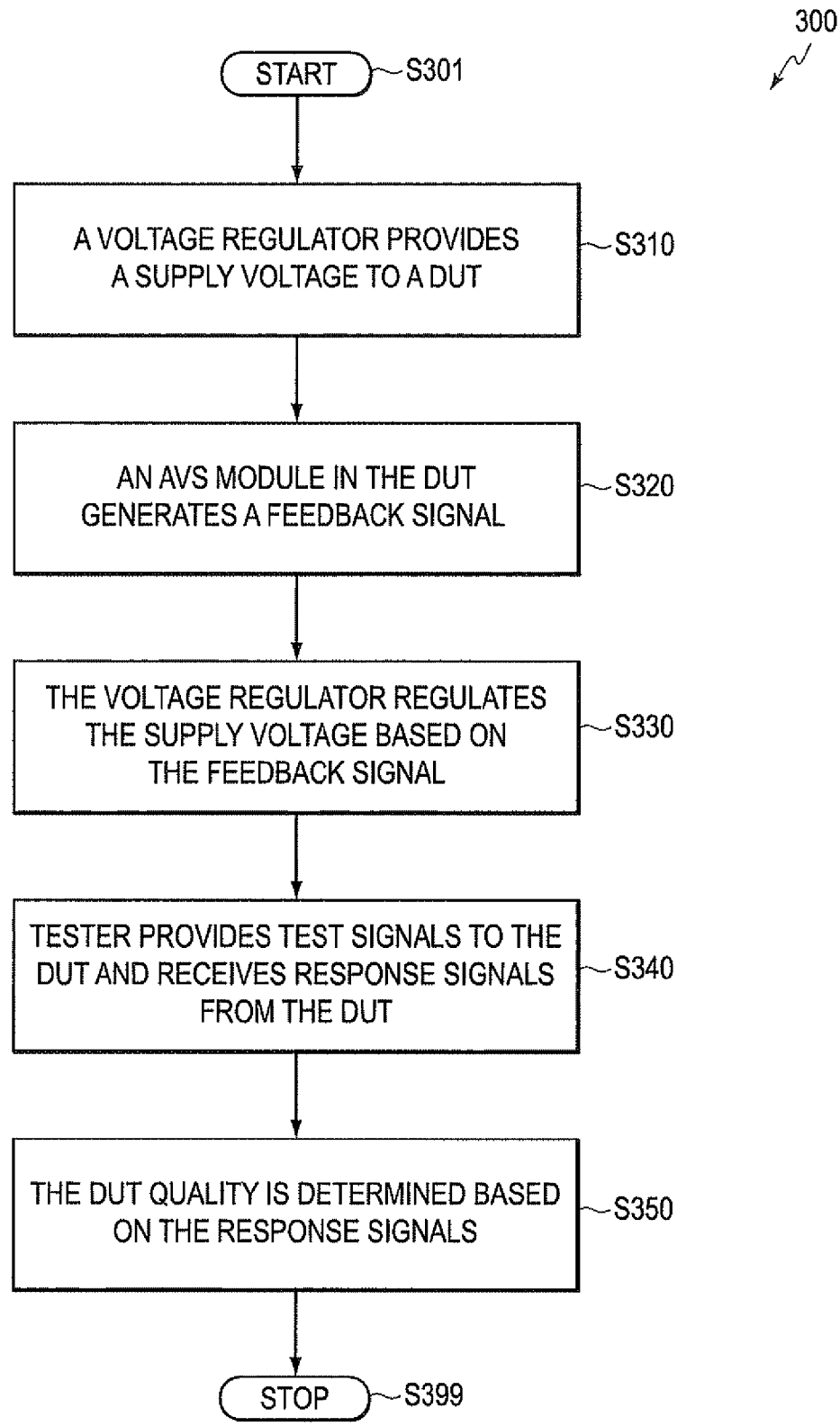

US 9,086,453 B2

METHOD AND APPARATUS FOR TESTING INTEGRATED CIRCUITS

INCORPORATION BY REFERENCE

This present disclosure claims the benefit of U.S. Provisional Application No. 61/487,157, "DUT Voltage Control For Automated Test Equipment," filed on May 17, 2011, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, integrated circuits (IC) testing uses automated test equipment (ATE) and an adapter board specific to an integrated circuits product to test each device under test (DUT) of the product. In an example, upon fabrication each packaged IC device of a product is inserted into a socket on the adapter board, and the adapter board is suitably connected to the ATE. Then, the ATE tests the packaged IC device via the adapter board and a determination is made as to whether the packaged IC device meets one or more specified performance requirements. For example, the ATE sends test signals to the packaged IC device and receives response signals from the packaged IC device via the adapter board.

SUMMARY

Aspects of the disclosure provide a testing method. The method includes supplying a power supply from a voltage regulator to a device under test (DUT). The DUT includes an adaptive voltage scaling module configured to generate a feedback signal in response to the power supply. Further, the method includes receiving the feedback signal from the DUT to the voltage regulator to regulate the power supply based on the feedback signal from the DUT, and determining whether the DUT meets a specified performance requirement while the voltage regulator regulates the power supply provided to the DUT based on the feedback signal received from the DUT.

In an embodiment, the feedback signal is generated based on at least a voltage within the DUT. In another embodiment, the feedback signal is generated based on at least a performance parameter of the DUT. In still another embodiment, the feedback signal is generated based on at least a comparison of a voltage within the DUT with a target voltage that is stored in the DUT.

According to an aspect of the disclosure, the method includes regulating the power supply based on a comparison of the feedback signal to a target for the feedback signal by the voltage regulator.

Further, in an example, the method includes sending test signals to the DUT, receiving response signals from the DUT, and determining whether the DUT meets the specified performance requirement based on the response signals.

Aspects of the disclosure provide a test system. The test system includes a voltage regulator, an adapter board and a tester. The voltage regulator is configured to output a power supply based on an input signal. The adapter board is configured for testing a DUT. The adapter board includes a first coupling configured to supply the power supply from the voltage regulator to the DUT. The DUT includes an adaptive voltage scaling module configured to generate a feedback signal in response to the power supply. The adapter board includes a second coupling configured to provide the feedback signal from the DUT as the input signal to the voltage regulator to regulate the power supply supplied to the DUT based on the feedback signal. The tester is configured to perform a functional test of the DUT while the voltage regulator regulates the power supply based on the feedback signal.

Aspects of the disclosure provide a circuit tested by a process. The process includes supplying a power supply from a voltage regulator to the circuit. The circuit includes an adaptive voltage scaling module configured to generate a feedback signal in response to the power supply. The process further includes providing the feedback signal from the circuit to the voltage regulator to regulate the power supply based on the feedback signal, and determining whether the circuit meets a specified performance requirement while the voltage regulator regulates the power supply based on the feedback signal output from circuit.

BRIEF DESCRIPTION OF THE DRAWINGS

Various embodiments of this disclosure that are proposed as examples will be described in detail with reference to the following figures, wherein like numerals reference like elements, and wherein:

FIG. 3 shows a flow chart outlining a process example 300 for the test system 100 to test the device under test 130 according to an embodiment of the disclosure.

DETAILED DESCRIPTION OF EMBODIMENTS

Figure 1:
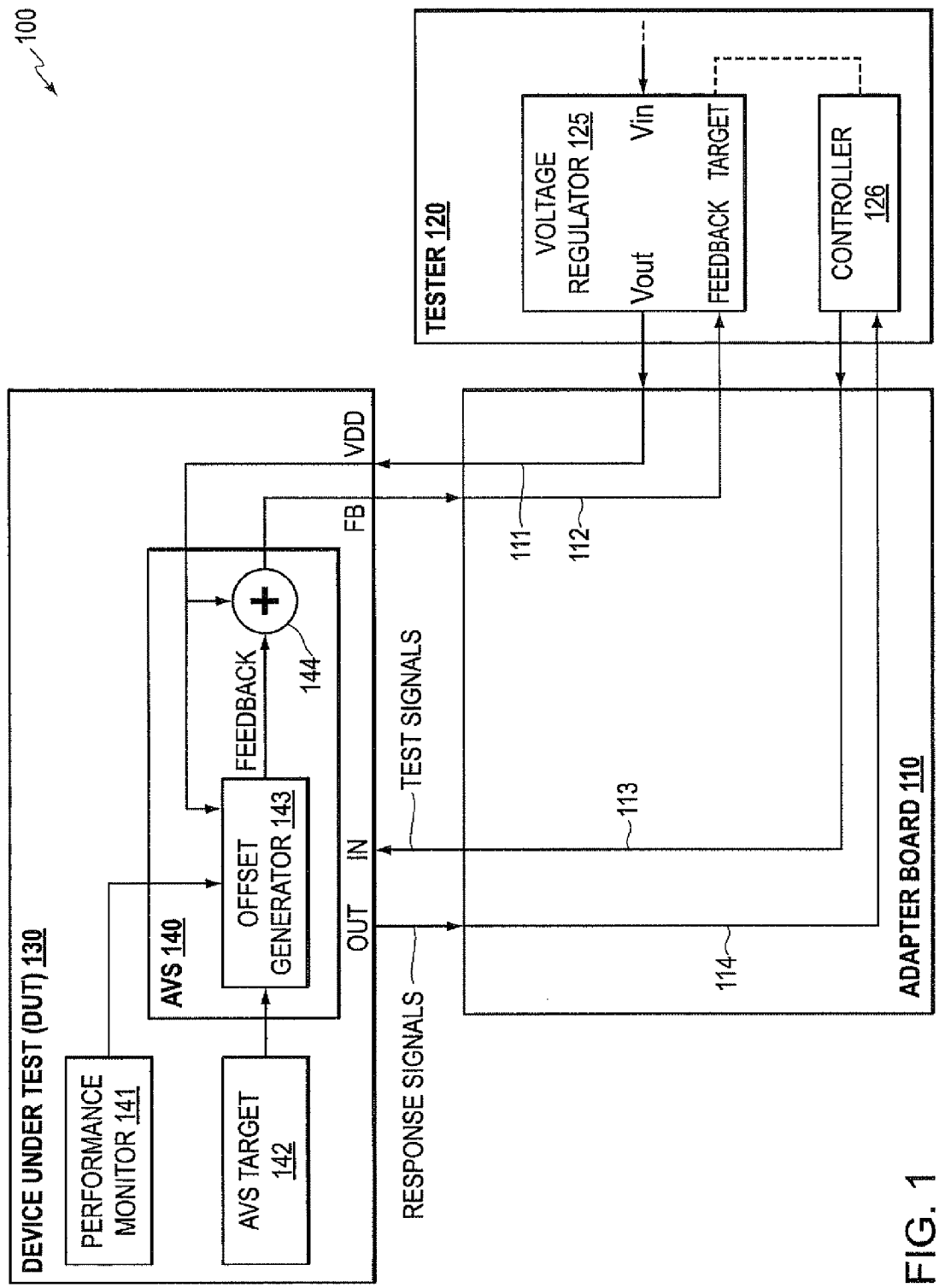
FIG. 1 shows a block diagram of a test system example 100 according to an embodiment of the disclosure.

FIG. 1 shows a block diagram of a test system example 100 that tests a device under test (DUT) 130 according to an embodiment of the disclosure. The test system 100 includes an adapter board 110 and a tester 120 with a voltage regulator 125. These elements are coupled together as shown in FIG. 1.

The DUT 130 can be any suitable device, such as an integrated circuit (IC) chip, a packaged IC device, and the like. The DUT 130 includes connection terminals, such as input terminals (IN), output terminals (OUT), a power terminal (VDD), a feedback terminal (FB), and the like, which are any suitable input output terminal. In an example, the connection terminals include pads on an IC chip. In another example, the connection terminals include pins of a pin grid array (PGA) package. In another example, the connection terminals include solder balls of a ball grid array (BGA) package.

According to an aspect of the disclosure, the VDD terminal is configured to receive a power supply from an external power source, and to provide the received power to circuits within the DUT 130 during operation. The FB terminal is configured to output a feedback signal to control to the power supply. In an embodiment, the feedback signal is generated in the DUT based on performance of the DUT. In some embodiments the feedback signal is an analog signal, while in other embodiments the feedback signal is a digital signal. The IN terminals are configured to receive input signals, such as test signals, and the OUT terminals are configured to drive output signals, such as response signals. In an embodiment, the input signals are utilized by circuitry in the DUT to generate feedback signals that are indicative of performance. It is noted that, in an example, the DUT 130 includes other suitable power terminal (not shown), such as a VSS terminal, a ground terminal, and the like. It is also noted that the IN terminals and OUT terminals can be input/output (I/O) terminals that can be configured as the IN terminals and/or the OUT terminals.

According to an aspect of the disclosure, the DUT 130 includes an adaptive voltage scaling (AVS) module 140 configured to generate the feedback signal indicative of the control to the power supply into the DUT 130. In an embodiment, the feedback signal is indicative of a performance metric of the DUT 130 and the feedback signal is used to control the power supply, such as disclosed in a co-pending application Ser. No. 12/730,829, filed Mar. 24, 2010, and assigned to Marvell Israel (M.I.S.L) LTD., which is incorporated herein by reference in its entirety.

In an embodiment, the feedback signal is generated, controlled and/or adjusted by the DUT 130 based on circuit parameters, such as performance parameters, voltage targets, and the like, during circuit operation. In an embodiment, the feedback signal is used generally by tester 120, and more specifically by voltage regulator 125, to control the power supply provided to the DUT 130 to compensate for various variations, such as process variation, supply voltage variation, temperature variation, and the like, of circuits in the DUT 130. Thus, because the feedback is generated in the DUT based on an actual performance of its own circuitry, the power levels at which the DUT 130 operates in a desired manner can be accurately determined.

In the FIG. 1 example, the AVS module 140 includes an offset generator 143, and a combiner 144. The AVS module 140 is implemented in an embodiment using suitable analog and/or digital circuits. In an example, the offset generator 143 generates an offset signal, such as an offset voltage, and the combiner 144 combines the offset voltage with a voltage indicative of the power supply received in the DUT 130 to generate the feedback signal.

According to an aspect of the disclosure, the offset generator 143 can generate the offset voltage based on various information provided by circuits in the DUT 130. In the FIG. 1 example, the offset generator 143 receives information from an AVS target 142, a performance monitor 141, and receives the voltage indicative of the received power supply in the DUT 130, such as disclosed in a co-pending application Ser. No. 12/979,724, filed Dec. 28, 2010, and assigned to Marvell Israel (M.I.S.L) LTD., which is incorporated herein by reference in its entirety. Then, the offset generator 143 generates the offset based on the received information.

In an embodiment, the AVS target 142 includes a storage component configured to store one or more voltage targets, and provides the stored voltage targets to the offset generator 143. For example, the AVS target 142 includes a memory configured to store a digital representation corresponding to a voltage target, and provides the digital representation to the offset generator 143. In an example, the offset generator 143 includes a digital to analog converter (not shown) configured to convert the digital representation to the voltage target in an analog form. Further, in an example, the offset generator 143 includes a comparator (not shown) configured to compare the voltage target with a received supply voltage from the VDD terminal and generates the offset voltage based on the comparison. The combiner 144 combines the offset voltage with the received supply voltage to generate the feedback signal.

In another example, the AVS target 142 stores a first digital representation corresponding to an upper limit voltage target, and a second digital representation corresponding to a lower limit voltage target. The offset generator 143 converts the first and second digital representations to the upper limit voltage target and lower limit voltage target in the analog form. Further, the offset generator 143 compares the received supply voltage from the VDD terminal with the upper limit voltage target and the lower limit voltage target and generates the offset voltage based on the comparison. The combiner 144 combines the offset voltage with the received supply voltage to generate the feedback signal.

In an example, when the received supply voltage is larger than the voltage target by a predetermined margin, the feedback signal is generated in a manner that is interpreted by the tester 120 to decrease the supply voltage; and when the received supply voltage is smaller than the voltage target by a predetermined margin, the feedback signal is generated in a manner that is interpreted by the tester 120 to increase the supply voltage.

In another example, the AVS target 142 includes an upper voltage limit and a lower voltage limit that define a target range. When the received supply voltage is larger than upper voltage limit, the feedback signal is generated in a manner that is interpreted by the tester 120 to decrease the supply voltage; and when the received supply voltage is smaller than the lower voltage limit, the feedback signal is generated in a manner that is interpreted by the tester 120 to increase the supply voltage.

In another embodiment, the performance monitor 141 includes one or more performance monitoring structures to monitor one or more performance parameters, and provides the monitored performance parameters to the offset generator 143. Then, the offset generator 143 generates the offset to be combined with the received supply voltage to generate the feedback signal that is interpreted by the tester 120 to cause the supply voltage to be adjusted so that the DUT 130 meets the performance. It is noted that the DUT 130 also includes various functional circuits (not shown) configured to perform various functions.

In an example, the DUT 130 is identified in a product specification to have a specified circuit speed, and the performance monitor 141 includes a speed monitoring structure, such as an oscillator, and the like configured to monitor a circuit speed during operation. Then, the performance monitor 141 provides a speed informative signal, such as an analog signal or a digital signal, indicative of the circuit speed to the offset generator 143. The offset generator 143 then generates the offset voltage based on the speed informative signal. In an example, when the speed informative signal indicates that the circuit speed is relatively slow, the offset generator 143 generates the offset voltage in a manner to increase the supply voltage, and thus to increase the circuit speed; and when the speed informative signal indicates that the circuit speed is relatively high that the DUT 130 may consume too much power, the offset generator 143 generates the offset voltage in a manner to decrease the supply voltage, and thus to decrease the circuit speed and reduce power consumption.

According to an aspect of the disclosure, the DUT 130 and the tester 120 form a close feedback loop that performance based feedback signal is generated on the DUT 130, and is provided to the tester 120 to adjust the supply voltage to the DUT 130. It is noted that the feedback signal can be analog or digital.

In an embodiment, the tester 120 includes the voltage regulator 125 and a controller 126. The voltage regulator 125 provides and regulates one or more power supplies to the DUT 130, and the controller 126 is configured to provide test signals to the DUT 130 via the adapter board 110 and to receive response signals of the DUT 130 via the adapter board 110. Based on the response signals, the controller 126 then determines whether the DUT 130 passes or fails tests.

The voltage regulator 125 is configured to provide a power supply based on a feedback signal. In the FIG. 1 example, the voltage regulator 125 includes a power input pin (Vin), a power output pin (Vout) and a feedback pin (FEEDBACK). The Vin pin receives an input power supply, such as from a power module (not shown) in the tester 120. The Vout pin outputs the power supply based on the feedback signal received from the FEEDBACK pin. In an embodiment, the FEEDBACK pin is configured to have relatively high input impedance.

According to an aspect of the disclosure, the voltage regulator 125 is configured to regulate the power supply based on the feedback signal that is generated in and controlled by the DUT 130. In an example, when the feedback signal indicates that the supply voltage is relatively low (e.g., the voltage of the feedback signal is lower than the supply voltage, the DUT 130 is too slow), the voltage regulator 125 increases the supply voltage output from the Vout pin; and when the feedback signal indicates that the supply voltage is relatively high (e.g., the voltage of the feedback signal is higher than the supply voltage, the DUT 130 is too fast), the voltage regulator 125 reduces the supply voltage output from the Vout pin.

In another example, the voltage regulator 125 in the tester 120 includes a target pin configured to receive a target voltage. In an example, the controller 126 provides the target voltage to the voltage regulator 125 via the target pin, and the FEEDBACK pin receives the feedback signal with the voltage level controlled and adjusted by the DUT 130. Then, the voltage regulator 125 compares the feedback signal with the target voltage, and regulates the power supply based on the comparison.

The adapter board 110 provides suitable interfaces for coupling the tester 120 with the DUT 130 during testing process to test the DUT 130. In an embodiment, the adapter board 110 includes printed circuits coupled with probe contactors. The adapter board 110 is suitably configured to connect selected terminals on the DUT 130 to the tester 120. In an example, the adapter board 110 is installed on a prober (not shown) that is suitably connected to the tester 120 via suitable connectors, such as Universal Serial Bus (USB), Peripheral Component Interconnect (PCI), PCI Extensions for Instrumentation (PXI), Local Area Network (LAN), General Purpose Interface Bus (GPIB), and the like. Further, the prober is suitably configured to force the probe contactors on the adapter board 110 to make electrical contacts with the IN, OUT, VDD and FB terminals on the DUT 130.

In another example, the adapter board 110 includes printed circuits coupled with a socket. The socket has suitable contactors, such as pin contactors configured to make electrical contacts with pins, solder ball contactors configured to make electrical contacts with solder balls, and the like. In an example, the adapter board 110 is installed on a handler (not shown) that is suitably connected with the tester 120 via suitable connectors, such as USB, PCI, PXI, LAN, GPM, and the like. During testing, the DUT 130 is plugged into the socket, and the contactors of the socket are forced to make electrical contacts with the IN, OUT, VDD and FB terminals.

The adapter board 110 includes various leads, such as solder traces, wires, cables, ribbon cable, jumpers, and the like, and suitable electrical components, such as resistors, capacitors, diodes, transistors, and the like, that form various couplings, such as conductive paths, signal traces and the like, between the DUT 130 and the tester 120.

According to an embodiment of the disclosure, the adapter board 110 includes a coupling 111 that is suitably configured to interface the VDD terminal of the DUT 130 with the Vout pin of the voltage regulator 125, a coupling 112 that is suitably configured to interface the FB terminal with the FEEDBACK pin of the voltage regulator 125, and couplings 113 and 114 that are configured to interface the IN terminals and OUT terminals of the DUT 130 with the tester 120. In an example, the coupling 111 includes printed wires of relatively large width and/or thickness to have relatively high conductivity for providing power supply. In another example, the coupling 112 includes relatively thin printed wires connected to the FEEDBACK pin of the voltage regulator 125 that has relatively high input impedance, such that no current flows on the coupling 112 and the voltage drop on the coupling 112 is substantially equal to zero.

According to an aspect of the disclosure, during operation, the actual performance of the DUT 130 and/or the supply voltage provided to the DUT 130 are monitored and determined on the DUT 130, and then the supply voltage actually required to meet the desired performance is supplied. It is thus readily ascertainable that the actual voltage supply required to meet a true performance requirement (determined on the DUT 130 itself) is within specification.

According to an aspect of the disclosure, the test system 100 power supply is configured similarly to device application power supply configuration in a customer product, and such configuration improves test coverage and increases product yield.

Figure 2:
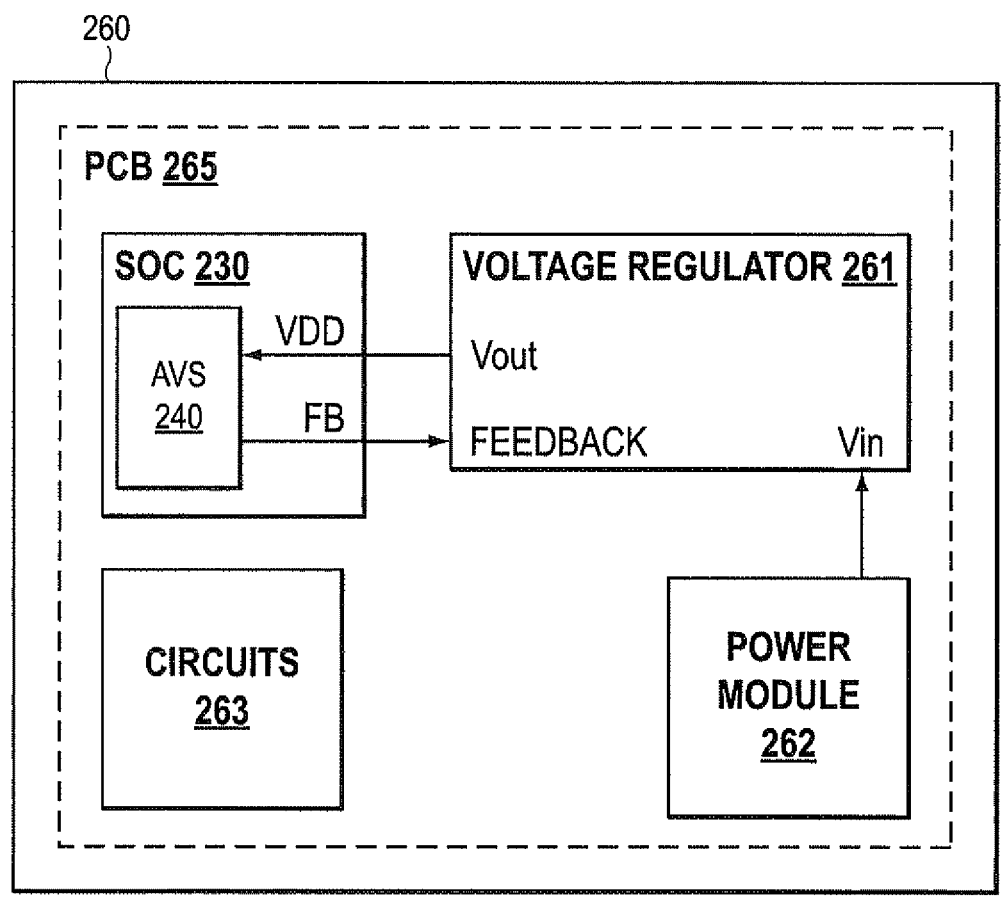
FIG. 2 shows a block diagram of an electronic system example 260 according to an embodiment of the disclosure.

FIG. 2 shows a block diagram of an electronic system example 260 according to an embodiment of the disclosure. In an example, the electronic system 260 is implemented by a customer using a device that passes various tests. In the FIG. 2 example, the electronic system 260 includes a printed circuit board (PCB) 265. Various components, such as a power module 262, a voltage regulator 261, a system-on-chip (SOC) 230, and other circuits 263, are mounted on the PCB 265. These elements are coupled together as shown in FIG. 2.

According to an aspect of the disclosure, the SOC 230 includes an AVS module 240, and the SOC 230 is tested as a DUT 130 by the test system 100 (FIG. 1) that is configured similarly to the electronic system 260. When the SOC 230 passes various tests applied by the test system 100, the SOC 230 is considered as a good device, and can be sold to the customer. The customer then uses the SOC 230 in the electronic system 260.

The electronic system 260 can be any suitable electronic system, such as a cellular phone, a laptop computer, a desktop computer, a network switch, a handheld device, a digital camera, a printer, and the like.

In the electronic system 260, the power module 262 provides power for the electronic system 260. In the FIG. 2 example, the power module 262 provides power to the SOC 230 via the voltage regulator 261. Specifically, the voltage regulator 261 includes a Vin pin configured to receive power supply from the power module 262, a Vout pin configured to output a supply voltage to the SOC 230, and a FEEDBACK pin configured to receive a feedback signal generated by the SOC 230 based on parameters of the circuits in the SOC 230 during operation. The voltage regulator 261 adjusts the supply voltage based on the feedback signal.

In an embodiment, the voltage regulator 261 includes a target voltage that is specified for the electronic system 260. The voltage regulator 261 compares the feedback signal with the target voltage and regulates the supply voltage output from the Vout pin based on the comparison. In an example, the electronic system 260 is specified to operate at 1V±5%, and the target voltage is set to 1V.

According to an aspect of the disclosure, the test system 100 power supply is configured to test the DUT 130 similarly to the power supply configuration in which the SOC 230 is used in the electronic system 260, such configuration improves product yield.

In the test system 100, in an example, the target voltage for the voltage regulator 125 is set to be 1V. The voltage supply to the DUT 130 is controlled by the DUT 130 itself based on circuit operation. When the DUT 130 passes the tests applied by the test system 100, the DUT 130 is considered as a good device, and can be sold to the customer and used as SOC 230.

In an example, a DUT device with the lowest operable voltage of 0.99V may fail, for example, a speed test using a fixed supply voltage of 0.95V corresponding to a worst power supply scenario, and is considered as a bad device.

When this DUT device is tested in the test system 100 as the DUT 130, the supply voltage is governed by feedback from the DUT 130 itself based on actual operational performance of circuits in the DUT. In an example, feedback from the DUT 130 controls the supply voltage to exceed 0.99V such that the DUT 130 can pass the tests in the test system 100 and be considered as a good device. Because the test system 100 is configured similarly to the configuration in which the DUT 130 will be used in an electronic system of a customer application, the DUT 130 is then deemed operable in a customer's system.

According to another aspect of the disclosure, the tests performed by the test system 100 on the DUT 130 have improved test coverage. The tests not only test functional circuits (not shown) of the DUT 130 but also test the operation of the AVS 140. Both the AVS 140 and the functional circuits have to function correctly to pass the tests.

According to another aspect of the disclosure, the test system 100 does not require a specified supply voltage to test all the DUTs. In the test system 100, each DUT 130 controls the supply voltage based on circuit operation within the DUT 130 itself. Thus, for different DUTs 130, the supply voltages can be different. In an embodiment, the supply voltage required by a given DUT to meet a performance requirement is monitored and DUTs are binned according to the supply voltage required to meet the specified performance requirement.

FIG. 3 shows a flow chart outlining a process example for the test system 100 to test the DUT 130 according to an embodiment of the disclosure. The process starts at S301, and proceeds to S310.

At S310, the voltage regulator 125 in the tester 120 provides a supply voltage to the DUT 130. It is noted that, in an embodiment, the voltage regulator 125 is not part of the tester 120. In an example, the voltage regulator 125 is external to the tester 120. In another example, the voltage regulator 125 is suitably mounted on the adapter board 110.

At S320, the DUT 130 is powered up, and the AVS module 140 in the DUT 130 generates the feedback signal based on circuit operation in the DUT 130. In an embodiment, the feedback signal is indicative of a performance metric of the DUT 130 and the feedback signal is used to control the power supply. In an example, the feedback signal is an analog voltage signal and the voltage level of the feedback signal is used to control the supply voltage. In another example, the feedback signal is a digital signal that the digital value of the digital signal is used to control the supply voltage. The feedback signal is driven out of the DUT 130, and is provided to the voltage regulator 125.

At S330, the voltage regulator 125 regulates the supply voltage based on the feedback signal. In an example, the voltage regulator 125 compares the voltage level of feedback signal to a target voltage, and adjusts the supply voltage based on the comparison. In another example, when the feedback signal is a digital signal, the voltage regulator adjusts the supply voltage based on the digital signal.

At S340, the tester 120 provides test signals to the DUT 130 and receives response signals from the DUT 130. It is noted that the tester 120 can perform any suitable tests, such as functional tests, scan tests, and the like, on the DUT 130.

At S350, the tester 120 determines the quality of the DUT 130 based on the response signals and or the actual supply voltage. In an example, when the DUT 130 passes all the tests, the tester 120 determines that the DUT 130 is a good device; and when the DUT 130 fails at least one test, the tester 120 determines that the DUT 130 is a bad device. In another example, when the supply voltage is within a target range, the tester 120 determines that the DUT 130 is a good device; and when the supply voltage is out of the target range, the tester 120 determines that the DUT 130 is a bad device. In another example, the tester 120 bins the DUT 130 based on the actual supply voltage. For example, when the supply voltage is within a relatively high voltage range, the tester 120 bins the DUT 130 in a slow bin; and when the supply voltage is within a relatively low voltage range, the tester 120 bins the DUT 130 in a fast bin. Then, the process proceeds to S399 and terminates.

It is noted that, in an example, the steps S310 to S330 are adaptively and continuously performed during a test process for the DUT 130 to adjust the supply voltage to the DUT 130, and at the same time, the step S340 is performed by the tester 120 to apply various tests on the DUT 130, and the step S350 is performed at end of each test. The test process stops when the tester 120 determines that the DUT 130 fails one test, or the DUT 130 passes all the tests.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method for testing an electronic device, comprising:
supplying a power supply from a voltage regulator of a tester for testing a performance parameter of a device under test (DUT), the DUT including an adaptive voltage scaling module configured to generate a feedback signal in response to the power supply;
receiving the feedback signal from the DUT to the voltage regulator of the tester to regulate the power supply supplied by the tester to the DUT based on the feedback signal from the DUT;
sending test signals to the DUT;
receiving response signals from the DUT; and
determining whether the DUT meets a specified performance requirement while the voltage regulator of the tester regulates the power supply provided to the DUT based on the feedback signal and the response signals received from the DUT.

2. The method of claim 1, wherein receiving the feedback signal from the DUT to the voltage regulator to regulate the power supply based on the feedback signal from the DUT further comprises:
receiving the feedback signal that is generated based on at least a voltage within the DUT.

3. The method of claim 1, wherein receiving the feedback signal output from the DUT to the voltage regulator to regulate the power supply based on the feedback signal from the DUT further comprises:

receiving the feedback signal that is generated based on at least a performance parameter of the DUT.

4. The method of claim 1, wherein receiving the feedback signal output from the DUT to the voltage regulator to regulate the power supply based on the feedback signal from the DUT further comprises:
  receiving the feedback signal that is generated based on at least a comparison of a voltage within the DUT with a target voltage that is stored in the DUT.

5. The method of claim 1, wherein receiving the feedback signal from the DUT to the voltage regulator to regulate the power supply based on the feedback signal from the DUT further comprises:
  regulating the power supply based on a comparison of the feedback signal to a target for the feedback signal by the voltage regulator.

6. The method of claim 1, further comprising:
  determining whether the DUT meets the specified performance requirement based on a voltage level of the power supply supplied to the DUT.

7. A test system, comprising:
  a voltage regulator of a tester configured to output a power supply based on an input signal;
  an adapter board configured for testing a DUT, the adapter board including:
    a first coupling configured to supply the power supply from the voltage regulator of the tester to test a performance parameter of the DUT, the DUT including an adaptive voltage scaling module configured to generate a feedback signal in response to the power supply; and
    a second coupling configured to provide the feedback signal from the DUT as the input signal to the voltage regulator of the tester to regulate the power supply supplied to the DUT based on the feedback signal; and
  a tester configured to perform a functional test of the DUT while the voltage regulator of the tester regulates the power supply based on the feedback signal.

8. The test system of claim 7, wherein the feedback signal is generated based on at least a voltage within the DUT.

9. The test system of claim 7, wherein the feedback signal is generated based on at least a performance parameter of the DUT.

10. The test system of claim 7, wherein the feedback signal is generated based on at least a comparison of a voltage within the DUT with a target voltage that is stored in the DUT.

11. The test system of claim 7, wherein the voltage regulator is configured to regulate the power supply based on a comparison of the feedback signal to a target for the feedback signal.

12. The test system of claim 7, wherein the tester is configured to determine whether the DUT meets the specified performance requirement based on a voltage level of the power supply supplied to the DUT.

13. The test system of claim 7, wherein the tester is configured to send test signals to the DUT, receive response signals from the DUT, and determine whether the DUT meets the specified performance requirement based on the response signals.

14. A circuit tested by a process, the process comprising:
  supplying a power supply from a voltage regulator of a tester to a device under test (DUT), the DUT including an adaptive voltage scaling module configured to generate a feedback signal in response to the power supply;
  providing the feedback signal from the DUT to the voltage regulator of the tester to regulate the power supply based on the feedback signal;
  sending test signals to the DUT;
  receiving response signals from the DUT; and
  determining whether the DUT meets a specified performance requirement while the voltage regulator of the tester regulates the power supply based on the feedback signal and the response signals output from the DUT.

15. The circuit of claim 14, wherein the DUT generates the feedback signal based on at least a voltage within the DUT.

16. The circuit of claim 14, wherein the DUT generates the feedback signal based on at least a performance parameter of the DUT.

17. The circuit of claim 14, wherein the DUT generates the feedback signal based on at least a comparison of a voltage within the DUT with a target voltage that is stored in the DUT.

18. The circuit of claim 14, wherein the process further comprises:
  determining whether the DUT meets the specified performance requirement based on a voltage level of the power supply supplied to the DUT.

* * * * *